United States Patent
Lehtola et al.

(10) Patent No.: US 12,206,363 B2
(45) Date of Patent: Jan. 21, 2025

(54) LOAD MODULATED POWER AMPLIFIERS

(71) Applicant: Skyworks Solutions, Inc., Irvine, CA (US)

(72) Inventors: Philip John Lehtola, Cedar Rapids, IA (US); David Steven Ripley, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 357 days.

(21) Appl. No.: 17/663,073

(22) Filed: May 12, 2022

(65) Prior Publication Data

US 2022/0385237 A1 Dec. 1, 2022

Related U.S. Application Data

(60) Provisional application No. 63/202,072, filed on May 26, 2021.

(51) Int. Cl.
*H03F 3/24* (2006.01)
*H03F 1/02* (2006.01)
*H04B 1/40* (2015.01)

(52) U.S. Cl.
CPC .......... *H03F 1/0222* (2013.01); *H03F 3/245* (2013.01); *H04B 1/40* (2013.01); *H03F 2200/102* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 6,349,216 B1* | 2/2002 | Alberth, Jr. ........... | H03F 1/0222 455/107 |
| 6,438,360 B1* | 8/2002 | Alberth, Jr. ........... | H03F 1/0222 330/129 |
| 6,556,814 B1* | 4/2003 | Klomsdorf .............. | H03F 1/565 455/121 |
| 6,725,021 B1* | 4/2004 | Anderson .............. | H03G 3/004 330/297 |
| 7,102,429 B2* | 9/2006 | Stengel ................. | H03F 1/0266 330/136 |
| 7,183,844 B2 | 2/2007 | Klimsdorf et al. | |
| 7,202,734 B1 | 4/2007 | Raab | |
| 7,212,421 B2 | 5/2007 | Chandra et al. | |

(Continued)

FOREIGN PATENT DOCUMENTS

EP 2288021 2/2011
WO WO 2010/141774 12/2010

*Primary Examiner* — Tuan A Tran
(74) *Attorney, Agent, or Firm* — Knobbe, Martens, Olson & Bear, LLP

(57) ABSTRACT

Apparatus and methods for load modulated power amplifiers are provided. In certain embodiments, a load modulated power amplifier system includes a power amplifier that receives a radio frequency signal at an input and provides an amplified radio frequency signal at an output, and a controllable load impedance coupled to the output of the power amplifier. The controllable load impedance receives an envelope signal that changes in relation to an envelope of the radio frequency signal, and the envelope signal is operable to control an impedance of the controllable load impedance to modulate a load at the output of the power amplifier.

20 Claims, 12 Drawing Sheets

(56) References Cited

U.S. PATENT DOCUMENTS

| | | |
|---|---|---|
| 7,244,007 B2 | 7/2007 | Ishizaki |
| 7,288,987 B2 | 10/2007 | Carichner et al. |
| 7,330,077 B2 | 2/2008 | Arnborg |
| 7,332,959 B2 | 2/2008 | Christian |
| 7,332,962 B2 | 2/2008 | Wu et al. |
| 7,352,237 B2 | 4/2008 | Snelgrove et al. |
| 7,355,473 B2 | 4/2008 | Wu et al. |
| 7,489,190 B2 | 2/2009 | Wu et al. |
| 7,586,376 B2 | 9/2009 | Litmanen |
| 7,602,155 B2 | 10/2009 | Markowski |
| 7,612,608 B2 | 11/2009 | Kozak et al. |
| 7,619,467 B2 | 11/2009 | Christian |
| 7,653,366 B2 | 1/2010 | Grigore |
| 7,719,377 B2 | 5/2010 | Luu et al. |
| 7,782,154 B2 | 8/2010 | Hou et al. |
| 7,859,474 B1 | 12/2010 | Cripe et al. |
| 7,937,049 B2 | 5/2011 | Phillips et al. |
| 7,956,683 B2 * | 6/2011 | Lejon .................. H04B 1/0475 330/136 |
| 7,962,108 B1 | 6/2011 | Khlat et al. |
| 7,990,214 B2 | 8/2011 | Markowski |
| 7,990,221 B2 | 8/2011 | Koizumi et al. |
| 8,018,277 B2 * | 9/2011 | Drogi ........................ H03F 3/19 330/136 |
| 8,072,271 B1 | 12/2011 | Spears et al. |
| 8,140,030 B2 * | 3/2012 | Takinami .............. H03F 1/0222 455/108 |
| 8,242,847 B1 | 8/2012 | Leong et al. |
| 8,254,854 B2 * | 8/2012 | Wang .................... H03F 1/0288 455/108 |
| 8,262,183 B2 | 9/2012 | Oshima et al. |
| 8,339,201 B1 | 12/2012 | Wilson et al. |
| 8,417,195 B2 | 4/2013 | Murdoch |
| 8,564,367 B2 | 10/2013 | Svechtarov |
| 8,757,749 B2 | 6/2014 | Oshima et al. |
| 8,773,098 B2 | 7/2014 | Tabata et al. |
| 8,798,561 B2 | 8/2014 | Acimovic |
| 8,841,965 B2 | 9/2014 | Nagashima |
| 8,855,584 B2 * | 10/2014 | Harris .................. H04B 1/0458 455/107 |
| 8,866,555 B2 * | 10/2014 | Manetakis .............. H03F 3/193 330/196 |
| 8,988,149 B2 * | 3/2015 | Lesso .................. H03G 3/3015 330/296 |
| 9,073,076 B2 | 7/2015 | Oshima et al. |
| 9,088,270 B2 | 7/2015 | Tabata et al. |
| 9,102,141 B2 | 8/2015 | Yoshino et al. |
| 9,112,463 B2 * | 8/2015 | Jeon ........................ H03F 3/191 |
| 9,147,701 B2 | 9/2015 | Saunders |
| 9,154,094 B2 | 10/2015 | Mohamed et al. |
| 9,166,538 B2 | 10/2015 | Hong et al. |
| 9,172,330 B2 | 10/2015 | Midya et al. |
| 9,174,435 B2 | 11/2015 | Yoshino et al. |
| 9,203,346 B2 * | 12/2015 | Irvine ...................... H03F 3/24 |
| 9,209,754 B2 * | 12/2015 | Embar .................. H03F 1/0288 |
| 9,246,454 B2 | 1/2016 | Schirmann et al. |
| 9,252,722 B2 | 2/2016 | Pham et al. |
| 9,425,742 B2 * | 8/2016 | Langer .................... H03F 3/195 |
| 9,432,060 B2 | 8/2016 | Hellberg |
| 9,484,861 B1 * | 11/2016 | Hammi .................... H03F 3/245 |
| 9,520,907 B2 * | 12/2016 | Peng ...................... H03F 1/0227 |
| 9,559,639 B2 | 1/2017 | Su et al. |
| 9,571,049 B2 * | 2/2017 | Zhang .................. H04B 1/0458 |
| 9,573,365 B2 | 2/2017 | Yoshino et al. |
| 9,698,739 B2 * | 7/2017 | Young .................... H03F 1/0205 |
| 9,742,375 B2 * | 8/2017 | Manssen .................. H03H 7/38 |
| 9,768,734 B2 | 9/2017 | Mohamed et al. |
| 9,780,730 B2 * | 10/2017 | Ma ............................ H03F 3/19 |
| 9,853,663 B2 * | 12/2017 | Manssen ............... H04W 24/08 |
| 9,876,478 B2 * | 1/2018 | Modi ..................... H04B 1/0458 |
| 9,882,588 B2 * | 1/2018 | Fong ...................... H03F 3/213 |
| 9,912,298 B2 | 3/2018 | Lyalin et al. |
| 9,948,243 B2 * | 4/2018 | Kobayashi ............. H03F 3/193 |
| 10,033,335 B1 | 7/2018 | Chan et al. |
| 10,211,786 B2 | 2/2019 | Wang et al. |
| 10,291,185 B2 | 5/2019 | Lyalin et al. |
| 10,361,744 B1 | 7/2019 | Khlat |
| 10,560,138 B2 | 2/2020 | Khlat |
| 10,574,188 B2 | 2/2020 | Wang et al. |
| 10,778,152 B2 | 9/2020 | Lyalin et al. |
| 10,833,634 B2 | 11/2020 | Chan et al. |
| 10,833,638 B2 | 11/2020 | Govindaraj |
| 10,892,787 B2 | 1/2021 | Abouelenin |
| 10,938,358 B2 | 3/2021 | Watkins |
| 11,043,920 B2 | 6/2021 | Chan et al. |
| 11,101,775 B2 | 8/2021 | Datta et al. |
| 11,190,143 B2 | 11/2021 | Pham et al. |
| 11,271,527 B2 | 3/2022 | Wang |
| 11,356,069 B2 | 6/2022 | Watkins |
| 2003/0095000 A1 | 5/2003 | Ramage et al. |
| 2004/0000948 A1 | 1/2004 | Stengel et al. |
| 2004/0207468 A1 | 10/2004 | Klomsdorf et al. |
| 2005/0208907 A1 | 9/2005 | Yamazaki et al. |
| 2005/0227646 A1 | 10/2005 | Yamazaki et al. |
| 2006/0217086 A1 | 9/2006 | Mekechuk et al. |
| 2006/0217087 A1 | 9/2006 | Snelgrove et al. |
| 2010/0069025 A1 * | 3/2010 | Takinami .................. H03F 3/19 375/295 |
| 2010/0084994 A1 | 4/2010 | Kao |
| 2011/0050338 A1 | 3/2011 | Christian |
| 2011/0241783 A1 | 10/2011 | Koizumi et al. |
| 2011/0254887 A1 | 10/2011 | Ide et al. |
| 2016/0276985 A1 | 9/2016 | Fager et al. |
| 2018/0093473 A1 | 4/2018 | Yoshino |
| 2018/0131333 A1 * | 5/2018 | Cabanillas ............. H03F 1/0272 |
| 2019/0165736 A1 * | 5/2019 | Khesbak ............... H03F 1/0266 |
| 2020/0112287 A1 | 4/2020 | Pham et al. |
| 2020/0313624 A1 | 10/2020 | Mokhti et al. |
| 2021/0021236 A1 | 1/2021 | Surakitbovorn et al. |
| 2021/0021238 A1 | 1/2021 | Chan et al. |
| 2021/0126597 A1 | 4/2021 | De Jong et al. |
| 2021/0218375 A1 | 7/2021 | Sharma et al. |
| 2021/0384868 A1 | 12/2021 | Datta et al. |
| 2022/0045649 A1 | 2/2022 | Ren et al. |
| 2022/0060151 A1 | 2/2022 | Pham et al. |
| 2022/0060156 A1 | 2/2022 | Chan et al. |
| 2022/0103137 A1 * | 3/2022 | Khlat .................... H03F 1/0222 |
| 2022/0158594 A1 | 5/2022 | Nikandish et al. |

\* cited by examiner

LOAD MODULATED POWER AMPLIFIERS

CROSS-REFERENCE TO RELATED APPLICATIONS

This application claims the benefit of priority under 35 U.S.C. § 119 of U.S. Provisional Patent Application No. 63/202,072, filed May 26, 2021 and titled "LOAD MODULATED POWER AMPLIFIERS," which is herein incorporated by reference in its entirety.

BACKGROUND

Field

Embodiments of the invention relate to electronic systems, and in particular, to radio frequency (RF) electronics.

Description of the Related Technology

Power amplifiers are used in RF communication systems to amplify RF signals for transmission via antennas.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. RF signals have a frequency in the range from about 30 kHz to 300 GHz, for instance, in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

SUMMARY

In certain embodiments, the present disclosure relates to a mobile device. The mobile device includes a transceiver configured to generate a radio frequency signal and an envelope signal that changes in relation to an envelope of the radio frequency signal, and a front end system including a load modulated power amplifier configured to amplify the radio frequency signal. The load modulated power amplifier includes a power amplifier configured to receive the radio frequency signal at an input and to provide an amplified radio frequency signal at an output, and a controllable load impedance coupled to the output of the power amplifier. The envelope signal is operable to control an impedance of the controllable load impedance to modulate a load at the output of the power amplifier.

In various embodiments, the transceiver includes a shaping circuit configured to shape the envelope signal based on calibration data. According to a number of embodiments, the shaping circuit is operable to provide a flat gain versus input power characteristic to the power amplifier.

In several embodiments, the controllable load impedance includes a controllable capacitor controlled by the envelope signal and an output balun having a first winding coupled to the output of the power amplifier and a second winding coupled to the controllable capacitor. According to a number of embodiments, the power amplifier includes an input balun and a pair of amplifiers coupled between the input balun and the output balun. In accordance with various embodiments, the second winding includes a first terminal that outputs the amplified radio frequency signal and a second terminal coupled to the controllable capacitor. According to some embodiments, the controllable capacitor includes a bipolar transistor and a load capacitor coupled to a collector of the bipolar transistor, the envelope signal operable to control a base of the bipolar transistor. In accordance with a number of embodiments, the controllable load impedance includes a series combination of an inductor and a controllable capacitor having a capacitance controlled by the envelope signal.

In various embodiments, the mobile device further includes an antenna operable to transmit the amplified radio frequency signal.

In certain embodiments, the present disclosure relates to a load modulated power amplifier system. The load modulated power amplifier system includes a power amplifier configured to receive a radio frequency signal at an input, and to provide an amplified radio frequency signal at an output. The load modulated power amplifier system further includes a controllable load impedance coupled to the output of the power amplifier and configured to receive an envelope signal that changes in relation to an envelope of the radio frequency signal. The envelope signal is operable to control an impedance of the controllable load impedance to modulate a load at the output of the power amplifier.

In several embodiments, the controllable load impedance includes a controllable capacitor controlled by the envelope signal and an output balun having a first winding coupled to the output of the power amplifier and a second winding coupled to the controllable capacitor. According a number of embodiments, the power amplifier includes an input balun and a pair of amplifiers coupled between the input balun and the output balun. In accordance with various embodiments, the second winding includes a first terminal that outputs the amplified radio frequency signal and a second terminal coupled to the controllable capacitor. According to some embodiments, the controllable capacitor includes a bipolar transistor and a load capacitor coupled to a collector of the bipolar transistor, the envelope signal operable to control a base of the bipolar transistor.

In various embodiments, the controllable load impedance includes a series combination of an inductor and a controllable capacitor having a capacitance controlled by the envelope signal.

In certain embodiments, the present disclosure relates to a method of amplification in a mobile device. The method includes generating a radio frequency signal and an envelope signal that changes in relation to an envelope of the radio frequency signal using a transceiver. The method further includes amplifying the radio frequency signal using a power amplifier, including receiving the radio frequency signal at an input to the power amplifier and providing an amplified radio frequency signal at an output of the power amplifier. The method further includes modulating a load of the power amplifier by using the envelope signal to control an impedance of a controllable load impedance coupled to the output of the power amplifier.

In various embodiments, the method further includes calibrating the power amplifier by shaping the envelope signal based on calibration data. According to a number of embodiments, calibrating the power amplifier includes providing a flat gain versus input power characteristic.

In several embodiments, modulating the load of the power amplifier includes controlling a capacitance of a controllable capacitor that is coupled to an output balun. According to a number of embodiments, the method further includes providing the amplified radio frequency signal to a first winding of the output balun, the controllable capacitor coupled to a second winding of the output balun.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
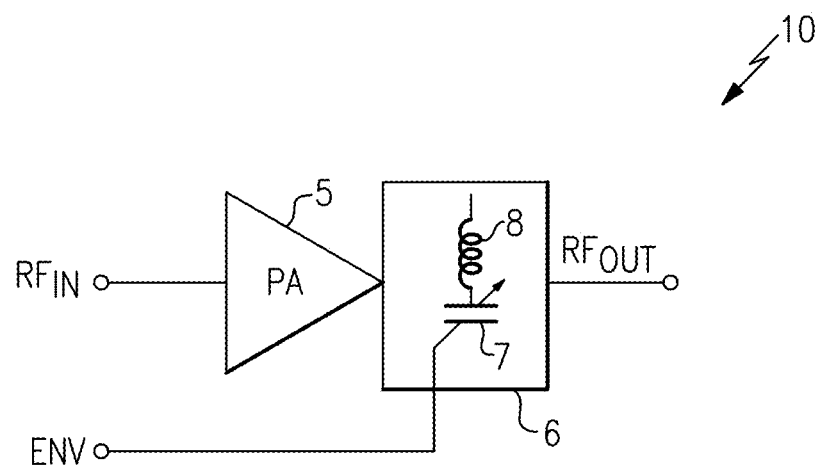
FIG. 1 is a schematic diagram of one embodiment of a load modulated power amplifier.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Load modulated power amplifiers are provided herein. In certain embodiments, a load modulated power amplifier includes a power amplifier that amplifies a radio frequency (RF) input signal, and a load impedance coupled to an output of the power amplifier. The load impedance is controlled based on an envelope of the RF input signal to provide load modulation to the output of the power amplifier. Providing load impedance modulation in this manner provides high efficiency over a wide dynamic range.

In certain implementations, the load impedance includes an output balun including a first winding and a second winding that are electromagnetically coupled to one another. Additionally, the output of the power amplifier is coupled to a first terminal of the first winding (or in a push-pull configuration with outputs coupled to two terminals of the first winding), while an amplified RF signal is outputted from a first terminal of the second winding. The load impedance further includes a controllable capacitor coupled to a second terminal of the second winding and having a capacitance controlled by the envelope of the RF signal.

Thus, load modulation can be performed by sweeping an impedance of a termination capacitor on the secondary port of the balun. In certain implementations, the termination capacitor is controlled by an analog envelope control signal from a transceiver, which can be calibrated to achieve desired gain and/or efficiency characteristics, such as isogain.

In certain implementations, the load impedance includes a heterojunction bipolar transistor (HBT) switch having a collector coupled to a capacitor and a base controlled by the envelope signal. Additionally, the HBT switch operates as a variable resistor with the highest load line achieved when the switch is open and with the lowest load line achieved at the highest envelope voltage level when the switch is closed. In such a configuration, the lowest loss is achieved at the highest load line, which is beneficial for modulated efficiency of a high peak-to-average power ratio (PAPR) waveform, such as those used in 5G communications.

In comparison to power amplifiers in which an envelope tracker controls a supply voltage of the power amplifier based on an envelope signal, the load modulated power amplifier has a load impedance controlled based on the envelope signal. Providing load modulation in this manner provides higher efficiency power amplifiers that are less complex than envelope tracking amplifiers, while leveraging circuitry for generating and calibrating the envelope signal for desired performance.

For example, a load modulated power amplifier can be powered by a high efficiency DC-to-DC converter, for instance, a power management unit (PMU) operating with an efficiency of 93% or higher. Such a PMU can, for instance, operate using average power tracking (APT) over 5.5V+2.5-3.0V (power amplifier efficiency can be better at higher supply voltage due to non-zero knee voltage). In contrast, an envelope tracking system may have only 80% efficiency, with the supply voltage ~2.5-3.0V (power amplifier efficiency can be worse at lower supply voltage due to non-zero knee voltage). A PMU is also referred to herein as a power management integrated circuit (PMIC).

Load modulated power amplifiers can be included in a wide variety of RF communication systems, including, but not limited to, base stations, network access points, mobile phones, tablets, customer-premises equipment (CPE), laptops, computers, wearable electronics, and/or other communication devices.

FIG. 1 is a schematic diagram of one embodiment of a load modulated power amplifier 10. The load modulated power amplifier 10 includes a power amplifier 5 and a controllable load impedance 6. The load modulated power amplifier 10 amplifies an RF input signal $RF_{IN}$ to generate an RF output signal $RF_{OUT}$.

The load modulated power amplifier 10 receives an envelope signal ENV that changes in relation to an envelope of the RF input signal $RF_{IN}$. The envelope signal ENV is used to control an impedance of the controllable load impedance 6. For example, in this embodiment, the controllable load impedance 6 includes a series combination of an inductor 8 and a controllable capacitor 7, and the envelope signal ENV is used to control a capacitance of the controllable capacitor 7. Although one example of a controllable load impedance is depicted, the teachings herein are applicable to other implementations of controllable load impedances.

Figure 2:
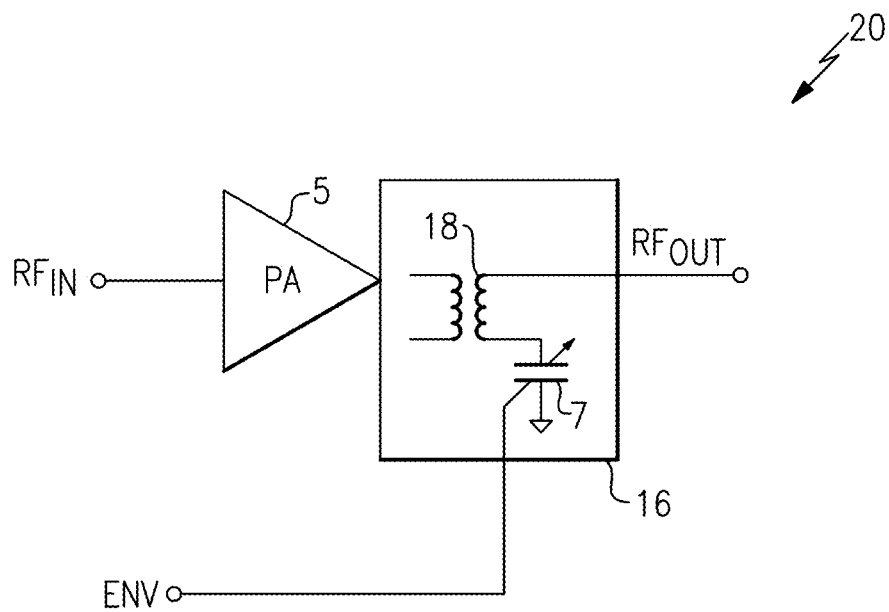
FIG. 2 is a schematic diagram of another embodiment of a load modulated power amplifier.

FIG. 2 is a schematic diagram of another embodiment of a load modulated power amplifier 20. The load modulated power amplifier 20 of FIG. 2 is similar to the load modulated power amplifier 10 of FIG. 1, except that the load modulated power amplifier 20 of FIG. 2 includes a different implementation of a controllable load impedance 16.

In particular, the controllable load impedance 16 includes a balun 18 and a controllable capacitor 7. An output of the power amplifier 5 drives a first winding of the balun 18. Additionally, a first terminal of a second winding of the balun 18 outputs the RF output signal $RF_{OUT}$, while a second terminal of the second winding is coupled to the controllable capacitor 7. The controllable capacitor 7 is controlled by the envelope signal ENV.

Changing a value of the controllable capacitor 7 effectively resonates out some of the inductance of the second winding, thereby effectively changing a turn ratio of the balun 18.

Figure 3:
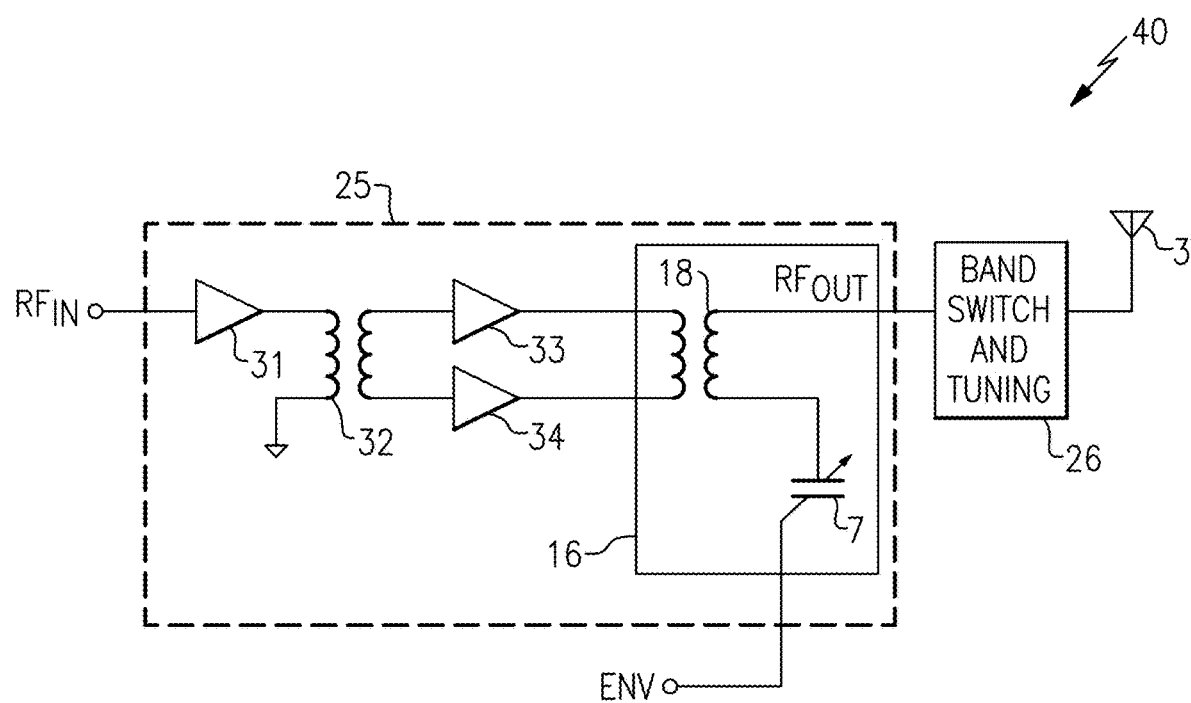
FIG. 3 is a schematic diagram of one embodiment of a load modulated power amplifier system.

FIG. 3 is a schematic diagram of one embodiment of a load modulated power amplifier system 40. The load modulated power amplifier system 40 includes a load modulated power amplifier 25, a band switching and tuning circuit 26, and an antenna 3.

In the illustrated embodiment, the load modulated power amplifier 25 includes a driver amplifier 31, an input balun 32, a first output amplifier 33, a second output amplifier 34, and a controllable load impedance 16 that includes an output balun 18 and a controllable capacitor 7.

The load modulated power amplifier 25 is implemented as a push-pull amplifier, in this embodiment. Additionally, an output of the first output amplifier 33 is connected to a first terminal of a first winding of the balun 18, while an output of the second output amplifier 34 is connected to a second terminal of the first winding of the balun 18.

Figure 4A:
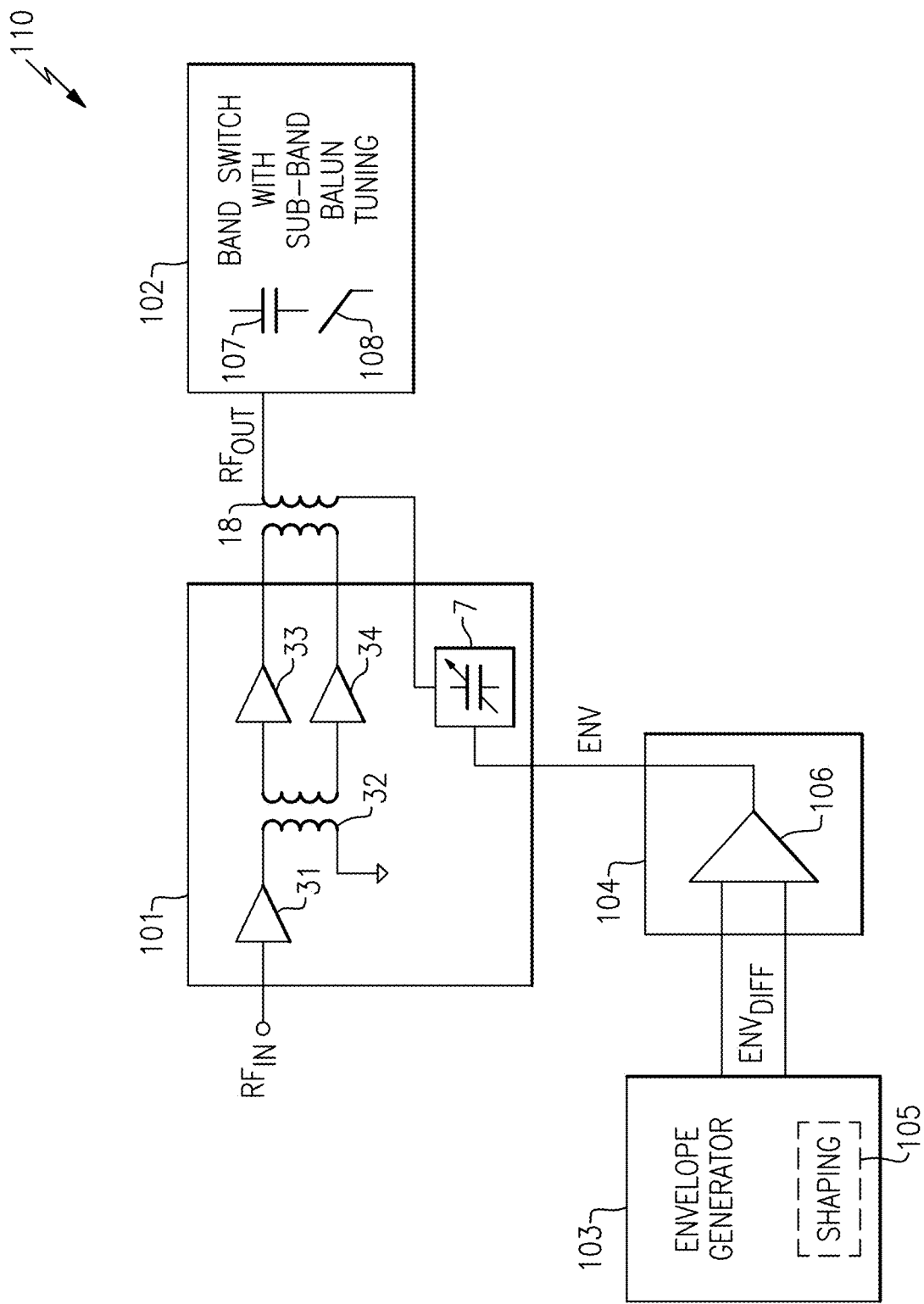
FIG. 4A is a schematic diagram of another embodiment of a load modulated power amplifier system.

FIG. 4A is a schematic diagram of another embodiment of a load modulated power amplifier system 110. The load modulated power amplifier system 110 includes an output balun 18, a power amplifier die 101, a switch die 102, an envelope generator die 103, and a driver die 104. The power amplifier die 101 includes a driver amplifier 31, an input balun 32, a first output amplifier 33, a second output amplifier 34, and a controllable capacitor 7. The switch die 102 includes a capacitor 107 and a switch 108. Furthermore, the envelope generator die 103 includes a shaping circuit 105 for shaping a differential envelope signal $ENV_{DIFF}$ provided to the driver die 104. The driver die 104 includes an amplifier 106 for receiving the differential envelope signal $ENV_{DIFF}$, and that outputs an envelope control signal ENV for controlling the controllable capacitor 7.

The load modulated power amplifier system 110 can operate with system level calibration for aligning and shaping the envelope control signal for the controllable capacitor 7 to the RF input signal amplified by the push-pull amplifier.

Figure 4B:
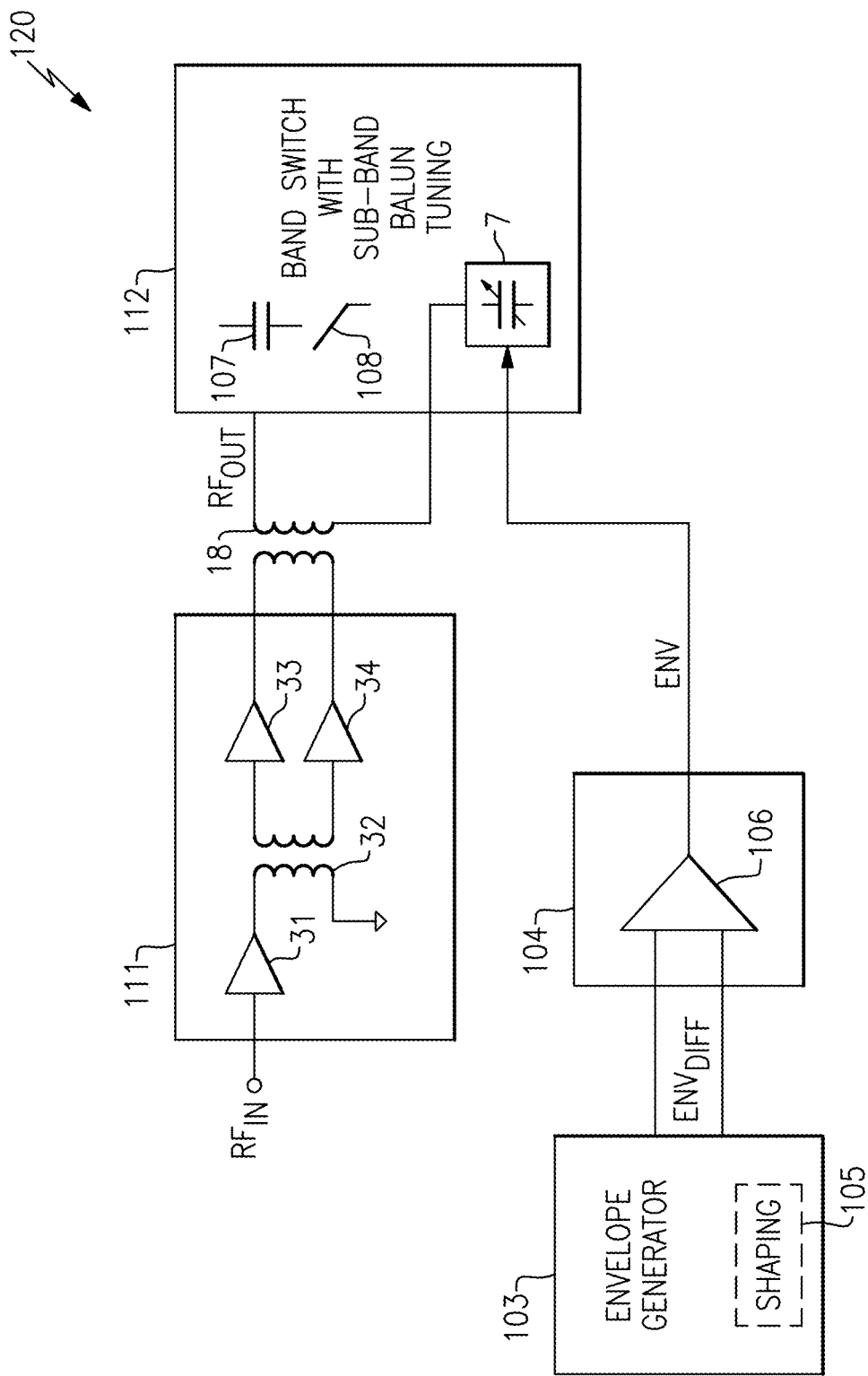
FIG. 4B is a schematic diagram of another embodiment of a load modulated power amplifier system.

FIG. 4B is a schematic diagram of another embodiment of a load modulated power amplifier system 120. The load modulated power amplifier system 120 includes an output balun 18, a power amplifier die 111, a switch die 112, an envelope generator die 103, and a driver die 104.

The load modulated power amplifier system 120 of FIG. 4B is similar to the load modulated power amplifier system 110 of FIG. 4A, except that the load modulated power amplifier system 120 illustrates an implementation in which the controllable capacitor 7 is on the switch die 112. Since the switch die 112 is typically implemented using a silicon on insulator (SOI) process and the power amplifier die 111 using a compound semiconductor process (for instance, GaAs), placing the controllable capacitor 7 on the switch die 112 aids in providing a high quality factor (Q-factor) capacitor.

Figure 5A:
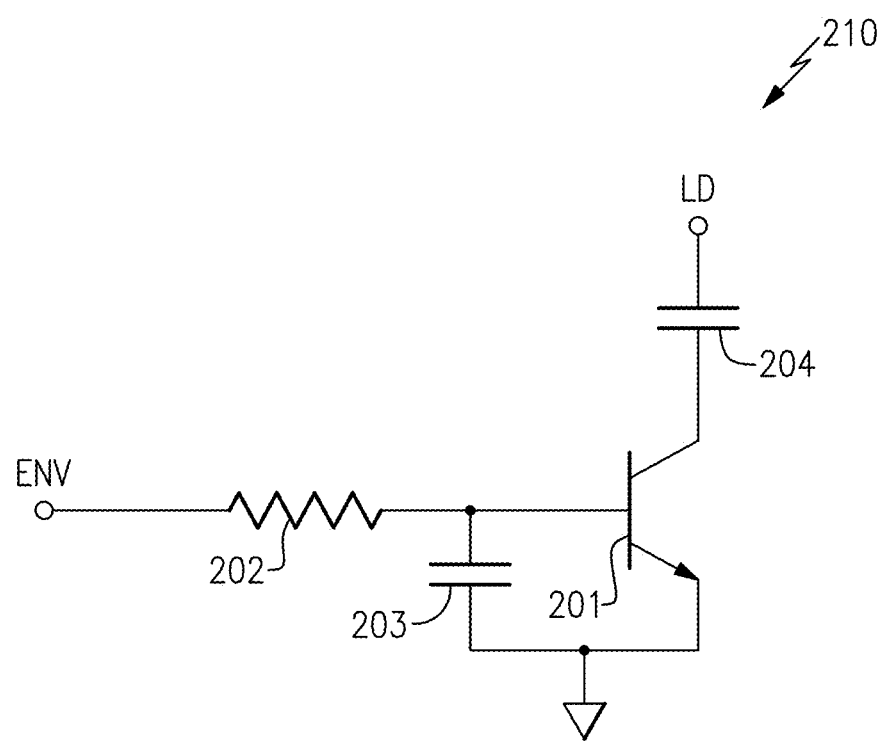
FIG. 5A is a schematic diagram of one embodiment of a controllable capacitor for a load modulated power amplifier.

FIG. 5A is a schematic diagram of one embodiment of a controllable capacitor 210 for a load modulated power amplifier. The controllable capacitor 210 includes a bipolar transistor 201 (for instance, a heterojunction bipolar transistor or HBT), a base resistor 202, a base capacitor 203, and a load capacitor 204. The base of the bipolar transistor 201 is controlled by an envelope signal ENV (received from an envelope tracker through the base resistor 202), while an emitter of the bipolar transistor 201 is grounded. The load capacitor 204 is coupled between a collector of the bipolar transistor 201 and a load terminal LD for loading a power amplifier (for instance, by serving as a termination capacitor to an output balun that is driven by the power amplifier). The base capacitor 203 is connected between the base of the bipolar transistor 201 and ground.

The bipolar transistor 201 operates as a variable resistor with the highest load line achieved when the envelope signal ENV is low and with the lowest load line achieved when the envelope signal ENV is high. The lowest loss is achieved at the highest load line, which is beneficial for modulated efficiency of a high PAPR waveform.

Figure 5B:
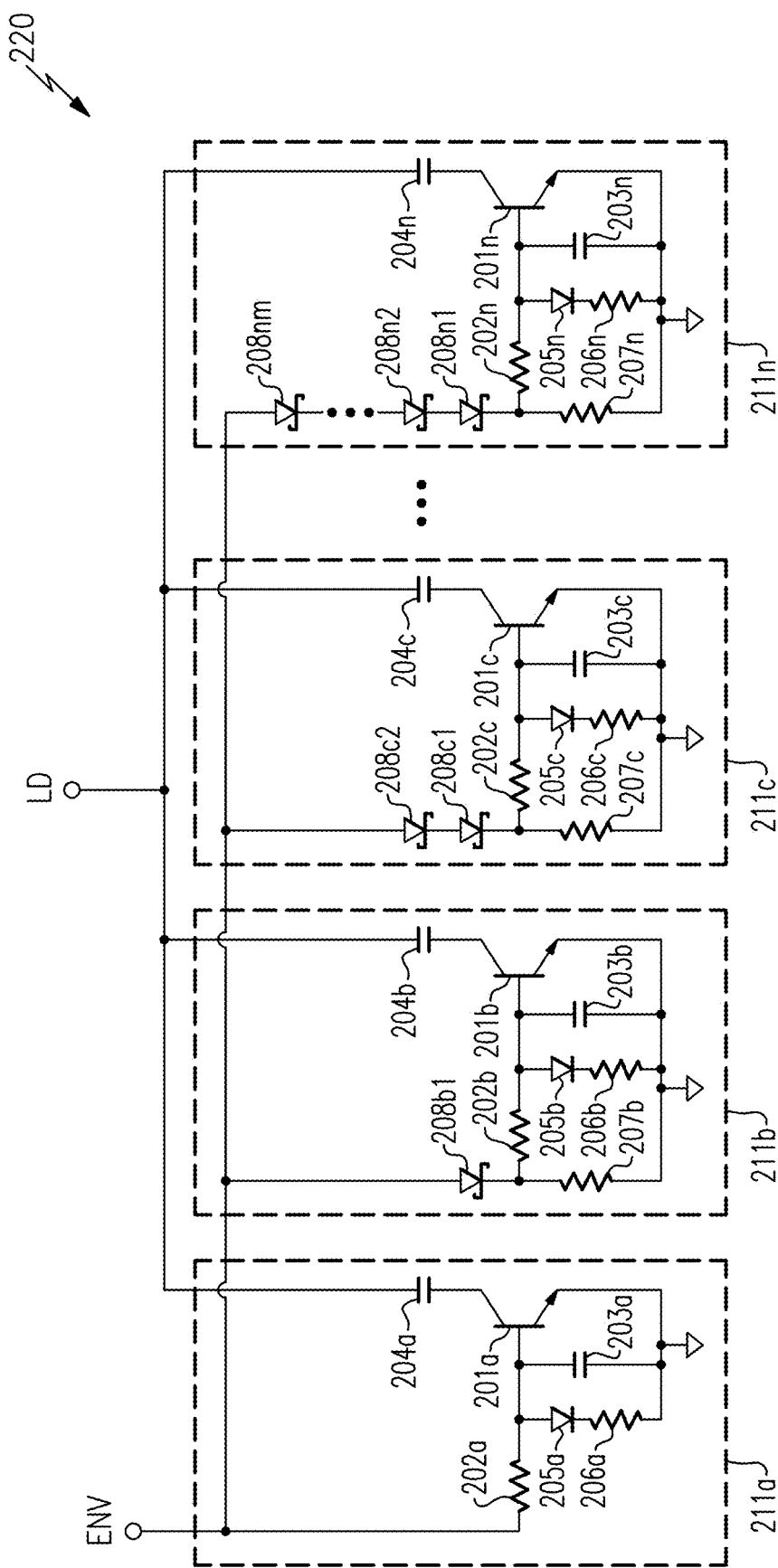
FIG. 5B is a schematic diagram of another embodiment of a controllable capacitor for a load modulated power amplifier.

FIG. 5B is a schematic diagram of another embodiment of a controllable capacitor 220 for a load modulated power amplifier. The controllable capacitor 220 includes a plurality of controllable capacitor cells 211a, 211b, 211c, . . . 211n that are connected in parallel with one another between a load terminal LD (for loading a power amplifier) and ground.

As shown in FIG. 5B, the controllable capacitor cell 211a includes a bipolar transistor 201a, a base resistor 202a, a base capacitor 203a, a load capacitor 204a, a clamping diode 205a, and a clamping resistor 206a. The base of the bipolar transistor 201a is controlled by an envelope signal ENV received through the base resistor 202a, while an emitter of the bipolar transistor 201a is grounded. The load capacitor 204a is coupled between a collector of the bipolar transistor 201a and the load terminal LD. The base capacitor 203a is connected between the base of the bipolar transistor 201a and ground. Additionally, the clamping diode 205a and the clamping resistor 206a are connected in series between the base of the bipolar transistor 201a and ground, with the capacitor 203a in parallel with the series combination of the clamping diode 205a and the clamping resistor 206a.

With continuing reference to FIG. 5B, the controllable capacitor cell 211b includes a bipolar transistor 201b, a base resistor 202b, a base capacitor 203b, a load capacitor 204b, a clamping diode 205b, a clamping resistor 206b, a diode-biasing resistor 207b and a Schottky diode 208b1. Additionally, the controllable capacitor cell 211c includes a bipolar transistor 201c, a base resistor 202c, a base capacitor 203c, a load capacitor 204c, a clamping diode 205c, a clamping resistor 206c, a diode-biasing resistor 207c, and Schottky diodes 208c1 and 208c2. Furthermore, the controllable capacitor cell 211n includes a bipolar transistor 201n, a base resistor 202n, a base capacitor 203n, a load capacitor 204n, a clamping diode 205n, a clamping resistor 206n, a diode-biasing resistor 207n, and Schottky diodes 208n1, 208n2, . . . 208nm.

Although four controllable capacitor cells are depicted, any number of controllable capacitor cells can be included. As shown in FIG. 5B, each additional controllable capacitor cell includes an additional Schottky diode in comparison to the prior controllable capacitor.

Figure 6:
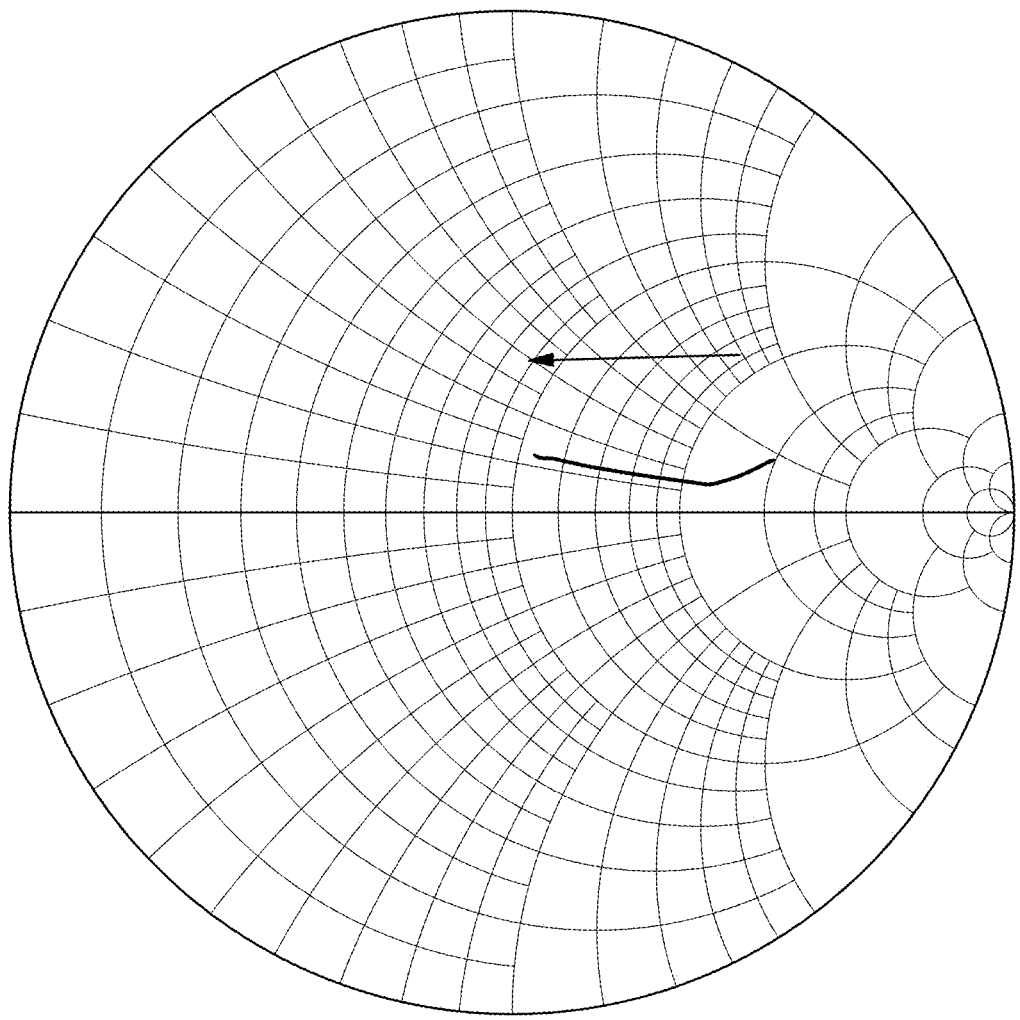
FIG. 6 is one example of a Smith chart of collector impedance versus control voltage for a load modulated power amplifier.

FIG. 6 is one example of a Smith chart of collector impedance versus control voltage for a load modulated power amplifier. In this example, over a 2× change (doubling) in load impedance is achieved when the envelope control voltage (VCTRL) is changed form 0.7 V to 2.1 V.

Figure 7:
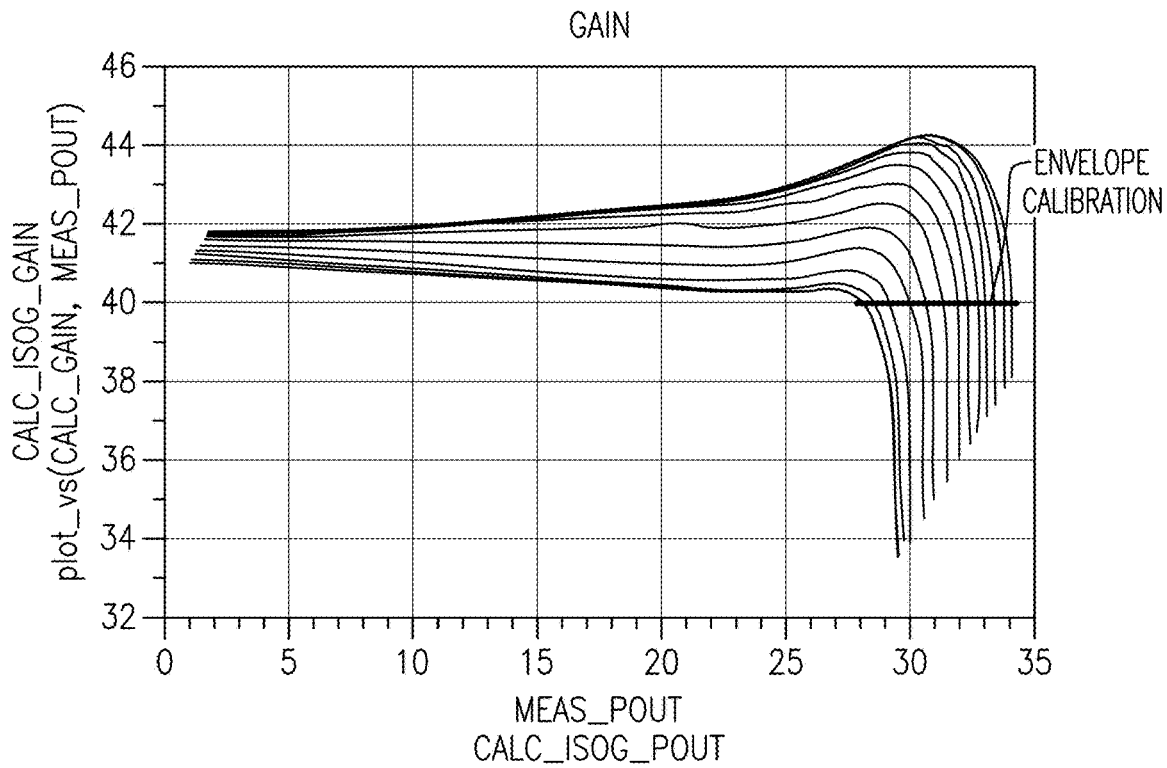
FIG. 7 is a graph of one example of gain versus output power plots for a load modulated power amplifier.

FIG. 7 is a graph of one example of gain versus output power plots for a load modulated power amplifier.

Figure 8:
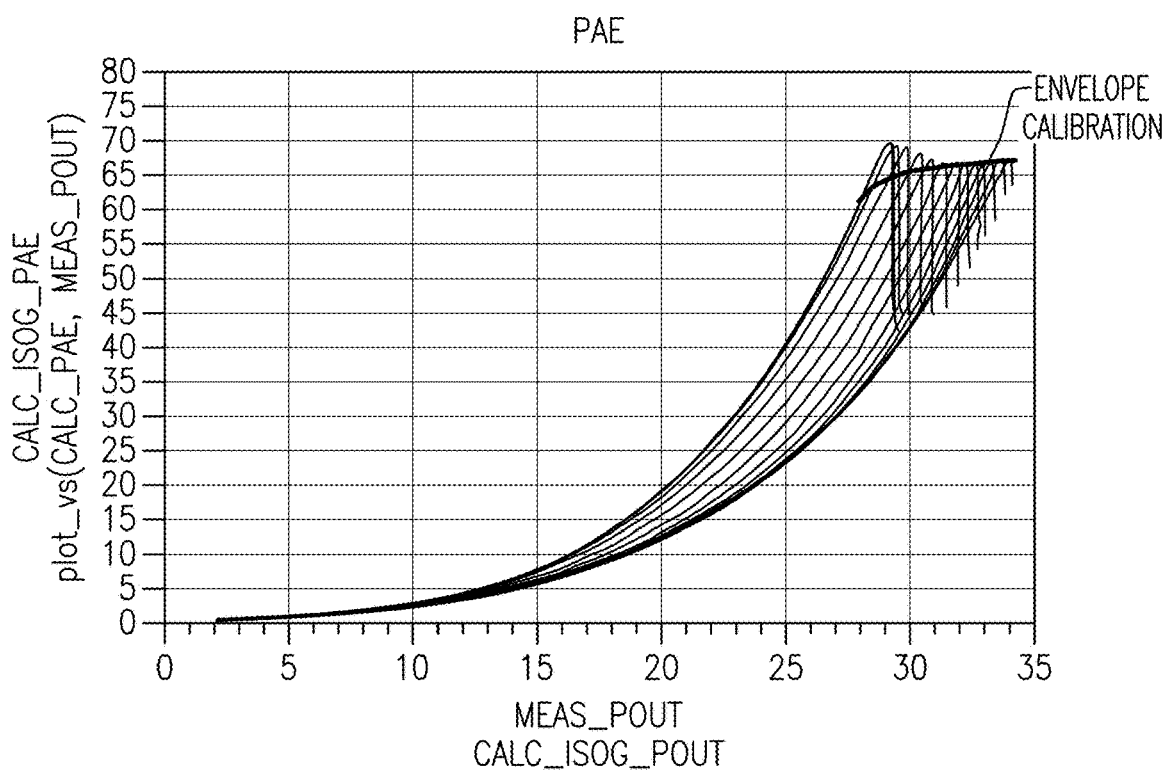
FIG. 8 is a graph of one example of power added efficiency (PAE) versus output power plots for a load modulated power amplifier.

FIG. 8 is a graph of one example of power added efficiency (PAE) versus output power plots for a load modulated power amplifier.

With reference to FIGS. 7 and 8, the graphs pertain to one implementation of a two-stage push pull power amplifier with 0.3 dB balun loss.

Waterfall curves are depicted with example values shown for achieving isogain with envelope calibration (for instance, by way of selecting shaping values in an envelope shaping circuit).

Figure 9:
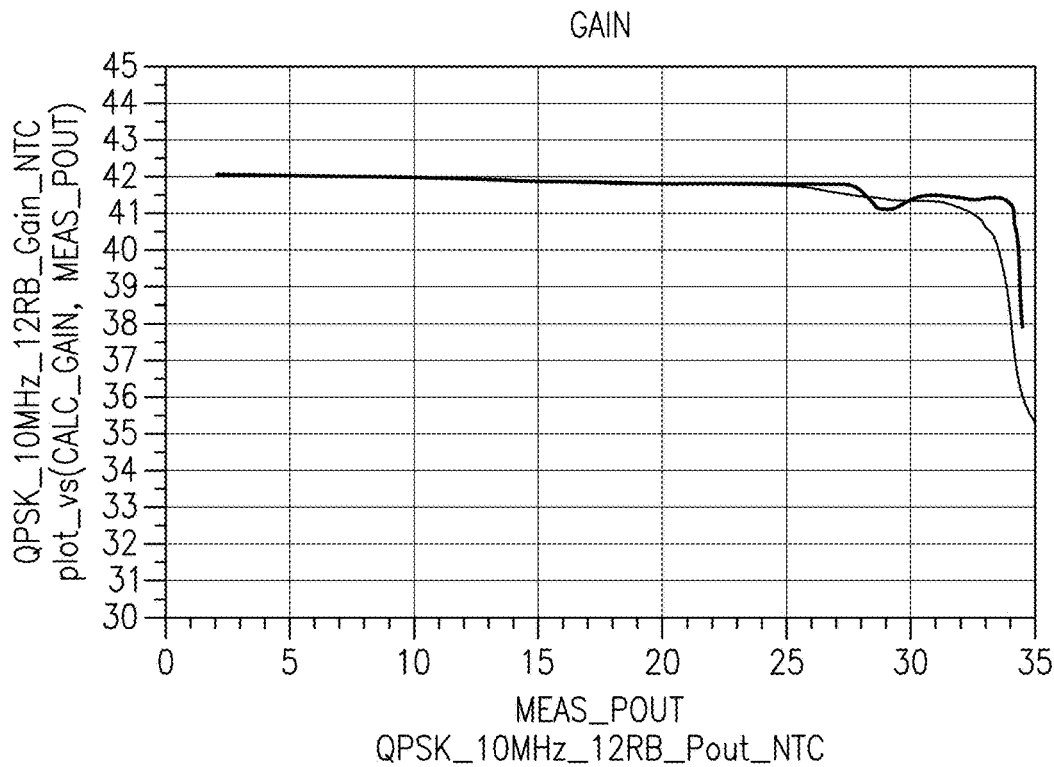
FIG. 9 is a graph of another example of gain versus output power plots for a load modulated power amplifier.

FIG. 9 is a graph of another example of gain versus output power plots for a load modulated power amplifier.

Figure 10:
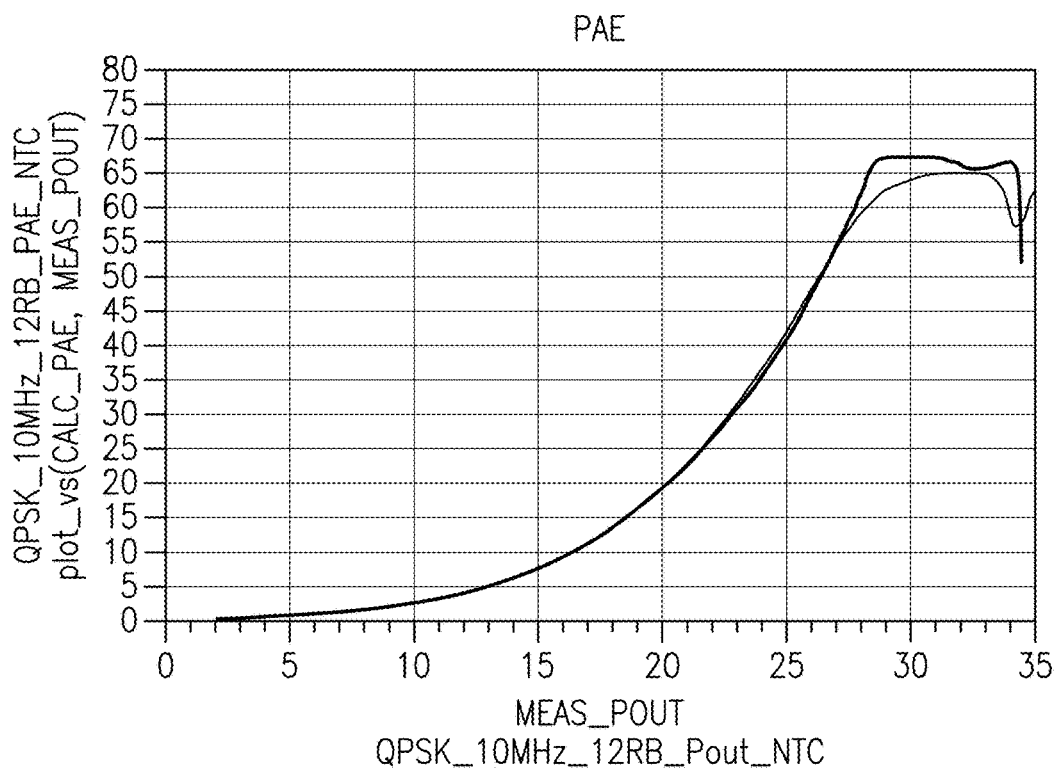
FIG. 10 is a graph of another example of PAE versus output power plots for a load modulated power amplifier.

FIG. 10 is a graph of another example of PAE versus output power plots for a load modulated power amplifier.

With reference to FIGS. 9 and 10, a very flat PAE is achieved in this example over 6 dB of dynamic range.

Figure 11:
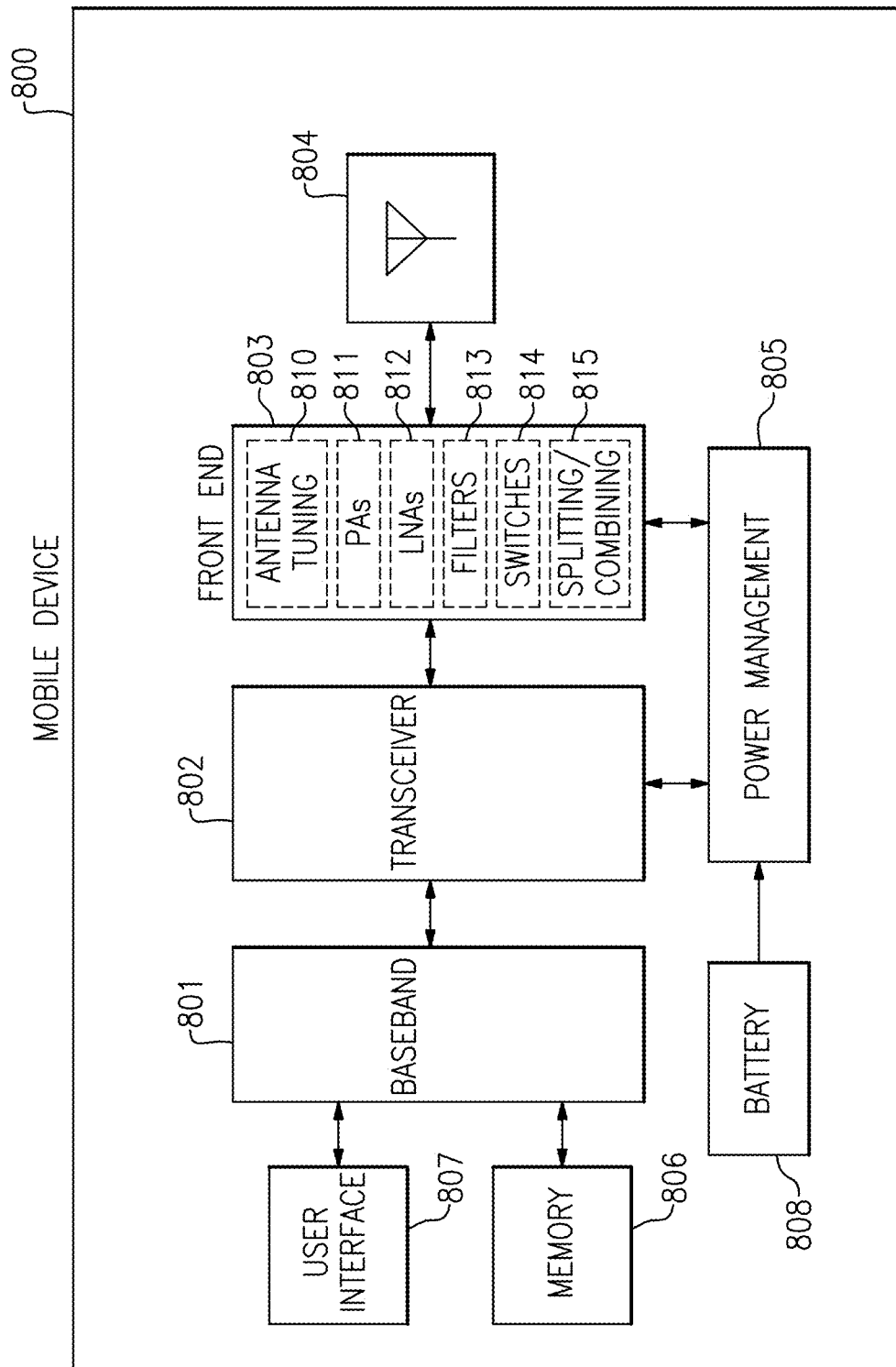
FIG. 11 is a schematic diagram of one embodiment of a mobile device.

FIG. 11 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 11 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

At least one of the power amplifiers 811 is implemented as a load modulated power amplifier in accordance with the teachings herein. Although the mobile device 800 illustrates one embodiment of a communication system that can be implemented with one or more load modulated power amplifiers, the teachings herein are applicable to a wide range of systems. Accordingly, other implementations are possible.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 11, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 11, the power management system 805 receives a battery voltage from the battery 808. The battery 808 can be any suitable battery for use in the mobile device 800, including, for example, a lithium-ion battery.

Figure 12A:
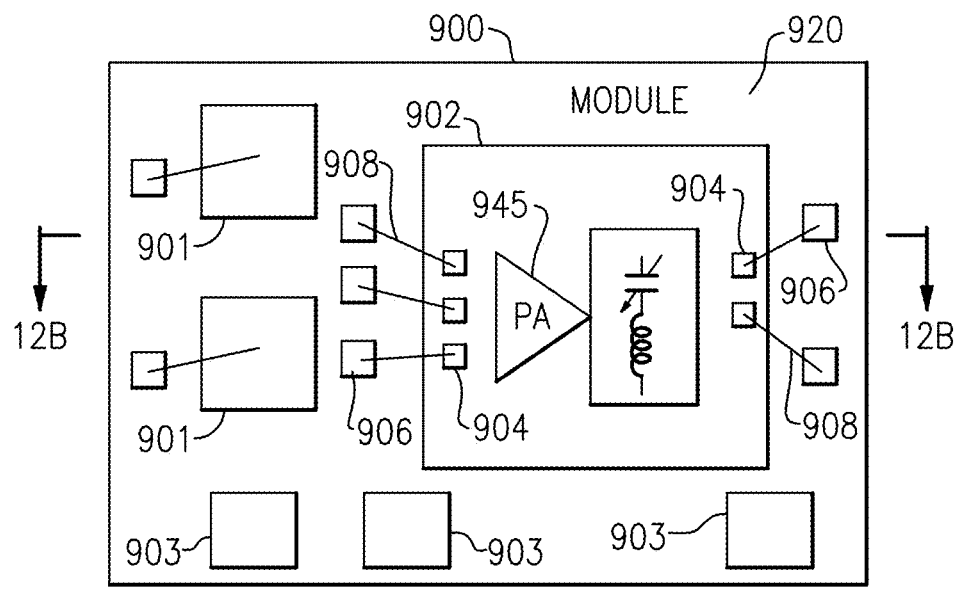
FIG. 12A is a schematic diagram of one embodiment of a packaged module.
Figure 12B:
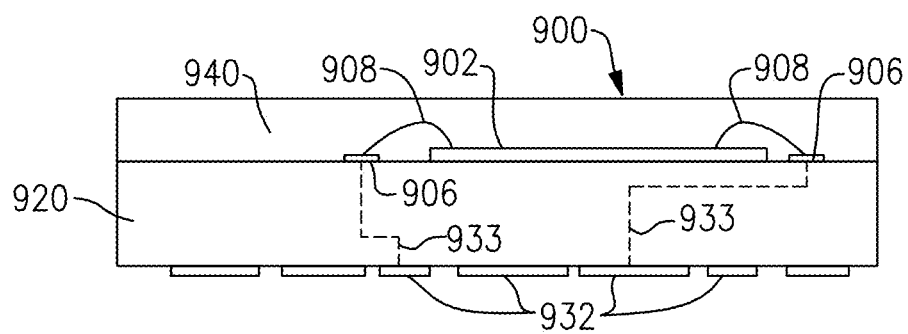
FIG. 12B is a schematic diagram of a cross-section of the packaged module of FIG. 12A taken along the lines 12B-12B.

FIG. 12A is a schematic diagram of one embodiment of a packaged module 900. FIG. 12B is a schematic diagram of a cross-section of the packaged module 900 of FIG. 12A taken along the lines 12B-12B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a load modulated power amplifier 945, which can be implemented in accordance with any of the embodiments herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 12B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 12B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Figure 13:
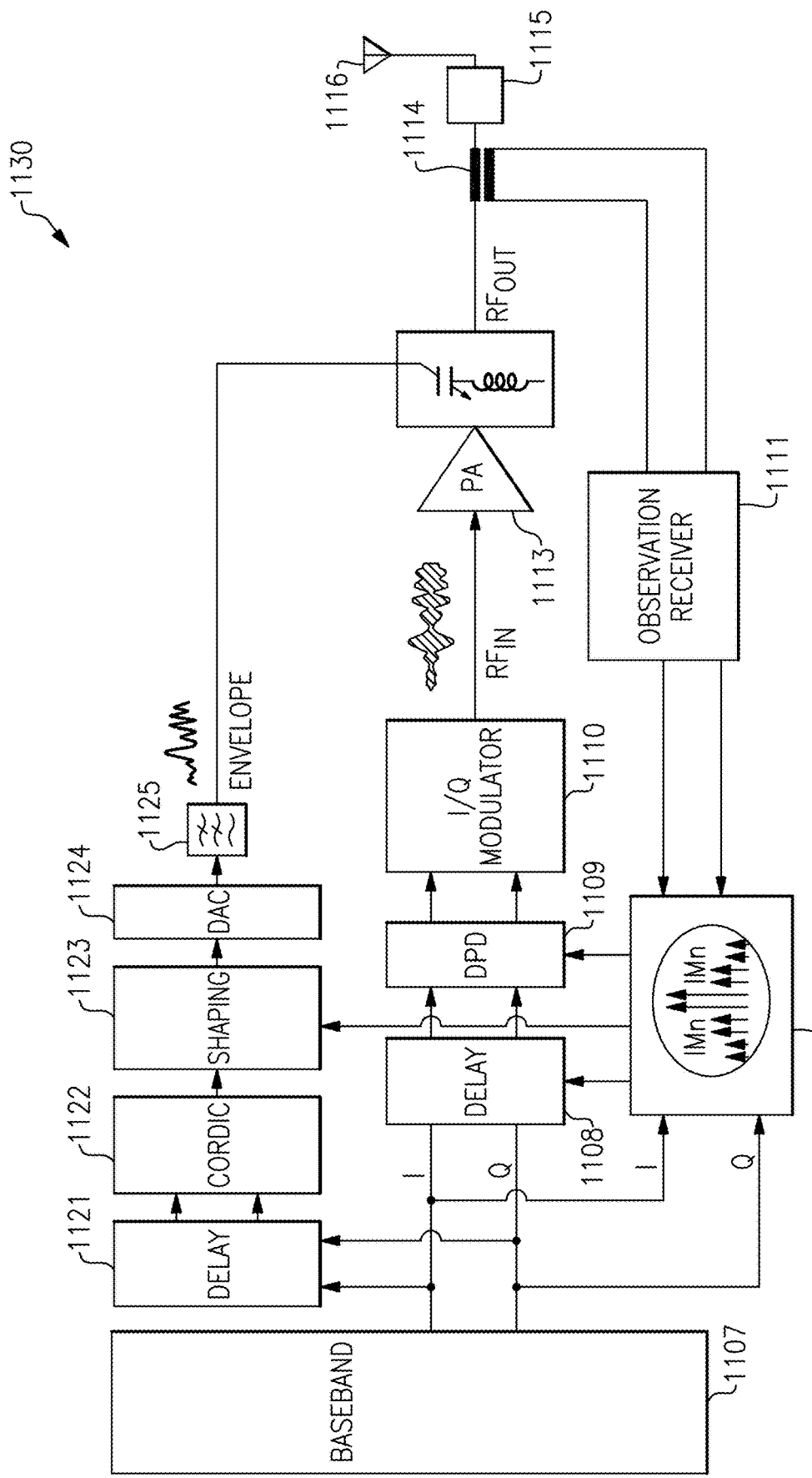
FIG. 13 is a schematic diagram of one embodiment of a communication system for transmitting RF signals.

FIG. 13 is a schematic diagram of one embodiment of a communication system 1130 for transmitting RF signals. The communication system 1130 includes a baseband processor 1107, a signal delay circuit 1108, a digital pre-distortion (DPD) circuit 1109, an I/Q modulator 1110, an observation receiver 1111, an intermodulation detection circuit 1112, a power amplifier 1113, a directional coupler 1114, a duplexing and switching circuit 1115, an antenna 1116, an envelope delay circuit 1121, a coordinate rotation digital computation (CORDIC) circuit 1122, a shaping circuit 1123, a digital-to-analog converter 1124, and a reconstruction filter 1125.

The communication system 1130 of FIG. 13 illustrates one example of an RF system including a load modulated power amplifier in accordance with the teachings herein. However, load modulated power amplifiers can be used in a wide variety of RF systems.

The baseband processor 1107 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 1110 in a digital format. The baseband processor 1107 can be any suitable processor configured to process a baseband signal. For instance, the baseband processor 1107 can include a digital signal processor, a microprocessor, a programmable core, or any combination thereof.

The signal delay circuit 1108 provides adjustable delay to the I and Q signals to aid in controlling relative alignment between the envelope signal and the RF signal $RF_{IN}$. The amount of delay provided by the signal delay circuit 1108 is controlled based on amount of intermodulation detected by the intermodulation detection circuit 1112.

The DPD circuit 1109 operates to provide digital shaping to the delayed I and Q signals from the signal delay circuit 1108 to generate digitally pre-distorted I and Q signals. In the illustrated embodiment, the pre-distortion provided by the DPD circuit 1109 is controlled based on amount of intermodulation detected by the intermodulation detection circuit 1112. The DPD circuit 1109 serves to reduce a distortion of the power amplifier 1113 and/or to increase the efficiency of the power amplifier 1113.

The I/Q modulator 1110 receives the digitally pre-distorted I and Q signals, which are processed to generate an RF signal $RF_{IN}$. For example, the I/Q modulator 1110 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 1113. In certain implementations, the I/Q modulator 1110 can include one or more filters configured to filter frequency content of signals processed therein.

The envelope delay circuit 1121 delays the I and Q signals from the baseband processor 1107. Additionally, the CORDIC circuit 1122 processes the delayed I and Q signals to generate a digital envelope signal representing an envelope of the RF signal $RF_{IN}$. Although FIG. 13 illustrates an implementation using the CORDIC circuit 1122, an envelope signal can be obtained in other ways.

The shaping circuit 1123 operates to shape the digital envelope signal to enhance the performance of the communication system 1130. In certain implementations, the shaping circuit 1123 includes a shaping table that maps each level of the digital envelope signal to a corresponding shaped envelope signal level. Envelope shaping can aid in controlling linearity, distortion, and/or efficiency of the power amplifier 1113.

In the illustrated embodiment, the shaped envelope signal is a digital signal that is converted by the DAC 1124 to an analog envelope signal. Additionally, the analog envelope signal is filtered by the reconstruction filter 1125 to generate an envelope signal suitable for modulating a load of the power amplifier 1113. In certain implementations, the reconstruction filter 1125 includes a low pass filter.

With continuing reference to FIG. 13, the power amplifier 1113 receives the RF signal $RF_{IN}$ from the I/Q modulator 1110, and provides an amplified RF signal $RF_{OUT}$ to the antenna 1116 through the duplexing and switching circuit 1115, in this example.

The directional coupler 1114 is positioned between the output of the power amplifier 1113 and the input of the duplexing and switching circuit 1115, thereby allowing a measurement of output power of the power amplifier 1113 that does not include insertion loss of the duplexing and switching circuit 1115. The sensed output signal from the directional coupler 1114 is provided to the observation receiver 1111, which can include mixers for down converting I and Q signal components of the sensed output signal, and DACs for generating I and Q observation signals from the downconverted signals.

The intermodulation detection circuit 1112 determines an intermodulation product between the I and Q observation signals and the I and Q signals from the baseband processor 1107. Additionally, the intermodulation detection circuit 1112 controls the pre-distortion provided by the DPD circuit 1109 and/or a delay of the signal delay circuit 1108 to control relative alignment between the envelope signal and the RF signal $RF_{IN}$. In certain implementations, the intermodulation detection circuit 1112 also serves to control shaping provided by the shaping circuit 1123.

By including a feedback path from the output of the power amplifier 1113 and baseband, the I and Q signals can be dynamically adjusted to optimize the operation of the communication system 1130. For example, configuring the communication system 1130 in this manner can aid in providing power control, compensating for transmitter impairments, and/or in performing DPD.

Although illustrated as a single stage, the power amplifier 1113 can include one or more stages. Furthermore, the teachings herein are applicable to communication systems including multiple power amplifiers.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
   a transceiver configured to generate a radio frequency signal and an envelope signal that changes in relation to an envelope of the radio frequency signal; and
   a front end system including a load modulated power amplifier configured to amplify the radio frequency signal, the load modulated power amplifier including a power amplifier configured to receive the radio frequency signal at an input and to provide an amplified radio frequency signal at an output, and a controllable load impedance coupled to the output of the power amplifier, the envelope signal operable to control an impedance of the controllable load impedance to modulate a load at the output of the power amplifier, the controllable load impedance including a controllable capacitor controlled by the envelope signal and an output balun having a first winding coupled to the output of the power amplifier and a second winding coupled to the controllable capacitor.

2. The mobile device of claim 1 wherein the transceiver includes a shaping circuit configured to shape the envelope signal based on calibration data.

3. The mobile device of claim 2 wherein the shaping circuit is operable to provide a flat gain versus input power characteristic to the power amplifier.

4. The mobile device of claim 1 wherein the power amplifier includes an input balun and a pair of amplifiers coupled between the input balun and the output balun.

5. The mobile device of claim 1 wherein the second winding includes a first terminal that outputs the amplified radio frequency signal and a second terminal coupled to the controllable capacitor.

6. The mobile device of claim 1 wherein the controllable capacitor includes a bipolar transistor and a load capacitor coupled to a collector of the bipolar transistor, the envelope signal operable to control a base of the bipolar transistor.

7. The mobile device of claim 1 further comprising an antenna operable to transmit the amplified radio frequency signal.

8. The mobile device of claim 1 further comprising a band switch having an input electrically connected to the second winding of the output balun.

9. The mobile device of claim 8 wherein the second winding of the output balun is electrically connected between the input of the band switch and the controllable capacitor.

10. A load modulated power amplifier system comprising:
a power amplifier configured to receive a radio frequency signal at an input, and to provide an amplified radio frequency signal at an output; and
a controllable load impedance coupled to the output of the power amplifier and configured to receive an envelope signal that changes in relation to an envelope of the radio frequency signal, the envelope signal operable to control an impedance of the controllable load impedance to modulate a load at the output of the power amplifier, the controllable load impedance including a controllable capacitor controlled by the envelope signal and an output balun having a first winding coupled to the output of the power amplifier and a second winding coupled to the controllable capacitor.

11. The load modulated power amplifier system of claim 10 wherein the power amplifier includes an input balun and a pair of amplifiers coupled between the input balun and the output balun.

12. The load modulated power amplifier system of claim 10 wherein the second winding includes a first terminal that outputs the amplified radio frequency signal and a second terminal coupled to the controllable capacitor.

13. The load modulated power amplifier system of claim 10 wherein the controllable capacitor includes a bipolar transistor and a load capacitor coupled to a collector of the bipolar transistor, the envelope signal operable to control a base of the bipolar transistor.

14. A method of amplification in a mobile device, the method comprising:
generating a radio frequency signal and an envelope signal that changes in relation to an envelope of the radio frequency signal using a transceiver;
amplifying the radio frequency signal using a power amplifier, including receiving the radio frequency signal at an input to the power amplifier and providing an amplified radio frequency signal at an output of the power amplifier; and
modulating a load of the power amplifier by using the envelope signal to control an impedance of a controllable load impedance coupled to the output of the power amplifier, modulating the load of the power amplifier including controlling a capacitance of a controllable capacitor that is coupled to an output balun.

15. The method of claim 14 further comprising calibrating the power amplifier by shaping the envelope signal based on calibration data.

16. The method of claim 15 wherein calibrating the power amplifier includes providing a flat gain versus input power characteristic.

17. The method of claim 14 further comprising providing the amplified radio frequency signal to a first winding of the output balun, the controllable capacitor coupled to a second winding of the output balun.

18. The method of claim 17 wherein the power amplifier includes an input balun and a pair of amplifiers coupled between the input balun and the output balun, the method further comprising providing the amplified radio frequency signal from the pair of amplifiers to the first winding of the output balun.

19. The method of claim 14 wherein the controllable capacitor includes a bipolar transistor and a load capacitor coupled to a collector of the bipolar transistor, the method further comprising using the envelope signal to control a base of the bipolar transistor.

20. The method of claim 14 further comprising transmitting the amplified radio frequency signal using an antenna.

* * * * *